United States Patent
Khoury et al.

(10) Patent No.: US 7,029,284 B2
(45) Date of Patent: Apr. 18, 2006

(54) FLOATING CONTACT ASSEMBLY FOR A STEERING WHEEL

(75) Inventors: Joseph E. Khoury, Gensingen (DE); Norbert G. Swidersky, Heidesheim (DE); Vladimir Karasik, Walled Lake, MI (US)

(73) Assignee: Methode Electronics, Inc., Chicago, IL (US)

( * ) Notice: Subject to any disclaimer, the term of this patent is extended or adjusted under 35 U.S.C. 154(b) by 163 days.

(21) Appl. No.: 10/713,049

(22) Filed: Nov. 17, 2003

(65) Prior Publication Data

US 2005/0106913 A1    May 19, 2005

(51) Int. Cl.
*H01R 39/00*    (2006.01)

(52) U.S. Cl. ......................................... 439/15; 439/164

(58) Field of Classification Search ................... 439/15, 439/164, 74, 76.1; 200/61.54, 61.27; 74/552
See application file for complete search history.

(56) References Cited

U.S. PATENT DOCUMENTS

| | | | | |
|---|---|---|---|---|
| 3,544,743 | A * | 12/1970 | Asano et al. | 200/61.54 |
| 4,616,224 | A * | 10/1986 | Reighard | 340/825.69 |
| 4,638,131 | A * | 1/1987 | Kidd et al. | 200/61.55 |
| 5,331,124 | A | 7/1994 | Danielson | |
| 5,952,633 | A * | 9/1999 | Leveque et al. | 200/61.54 |
| 5,977,495 | A * | 11/1999 | Akimoto | 200/61.54 |
| 6,147,315 | A * | 11/2000 | Rudolph et al. | 200/61.54 |
| 6,150,621 | A | 11/2000 | Nishitani et al. | |
| 6,403,899 | B1 * | 6/2002 | Fitzpatrick et al. | 200/61.54 |
| 6,733,300 | B1 * | 5/2004 | Oguma | 439/15 |
| 6,907,328 | B1 * | 6/2005 | Fehr et al. | 701/29 |
| 2004/0095739 | A1 * | 5/2004 | Parker et al. | 362/26 |

FOREIGN PATENT DOCUMENTS

| | | |
|---|---|---|
| EP | 1 091 376 A3 | 4/2001 |
| JP | 2-95949 | 4/1990 |
| JP | 10-338146 | 12/1998 |

OTHER PUBLICATIONS

European Search Report dated Apr. 26, 2005.

* cited by examiner

*Primary Examiner*—P. Austin Bradley
*Assistant Examiner*—Phuongchi Nguyen
(74) *Attorney, Agent, or Firm*—Blank Rome LLP

(57) ABSTRACT

The present invention is directed towards an electrical contact assembly in a steering wheel that allows the contacts of a primary circuit board to move relative to the corresponding contacts of a secondary circuit board without disengaging the electrical connection. Thus, any minor deviation in the positioning of the primary or secondary circuit board may be compensated for without the loss of electrical contact. The primary circuit board is located in the center of the steering wheel around the steering column. The primary circuit board includes left and right arms which engage and cooperate with left and right button assemblies on the steering wheel to actuate various vehicle controls, such as radio volume and tuning control, in the vehicle. The arms include leaf-spring contacts which resiliently and non-fixedly engage the secondary circuit board which is connected to control buttons on the steering wheel.

10 Claims, 4 Drawing Sheets

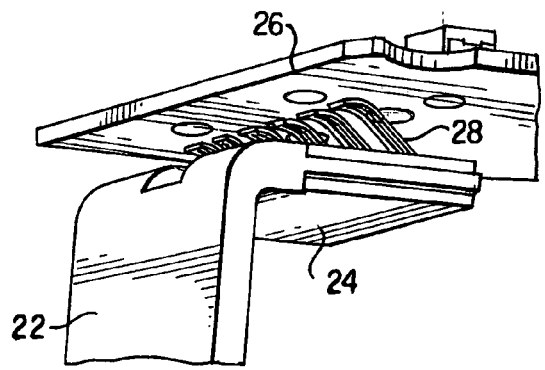
FIG. 3D
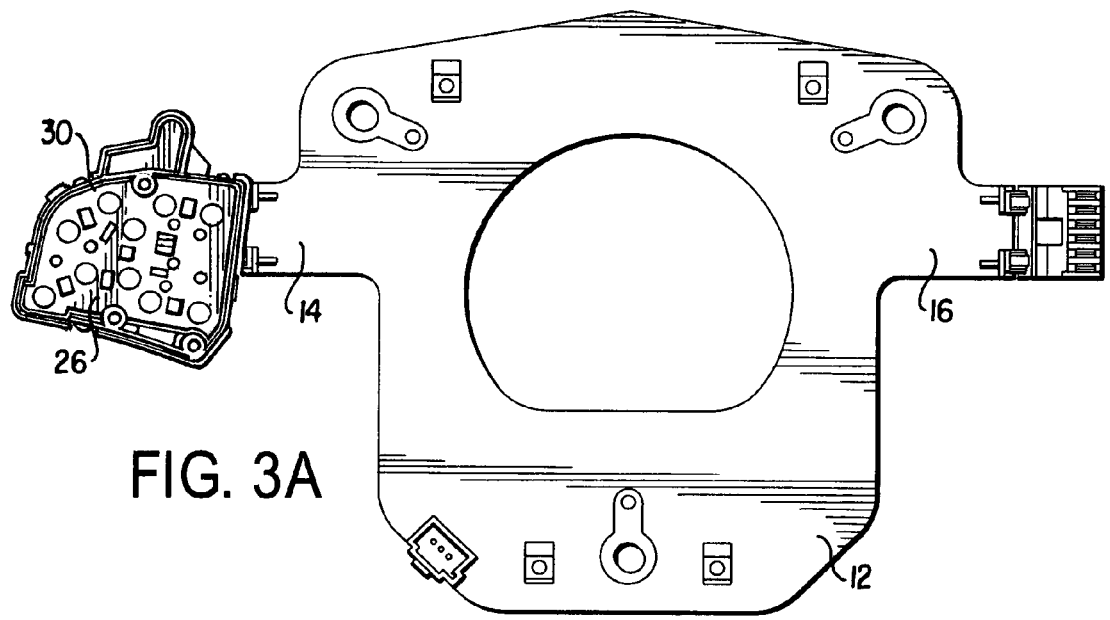
FIG. 3A
FIG. 3B
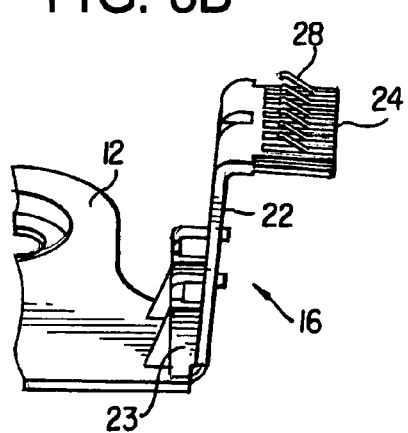
FIG. 3C
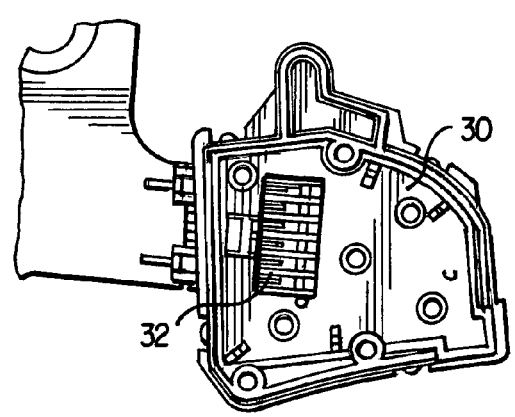

FLOATING CONTACT ASSEMBLY FOR A STEERING WHEEL

FIELD OF THE INVENTION

The present invention is directed to a contact positioning assembly for a steering wheel having a primary circuit board with spring contacts engaging corresponding contacts connected to control buttons on the steering wheel, such that the spring contacts may move relative to the corresponding contacts of the control buttons without disconnecting therefrom.

BACKGROUND OF THE INVENTION

Vehicle manufacturers are increasingly incorporating features and functionality into the steering wheel of a car, such as radio volume and tuning control, mobile phone, and cruise control features to allow drivers to operate the various functions of the vehicle without taking their hands off the steering wheel. This provides the driver with the convenience of being able to easily control vehicle functions while decreasing the likelihood of accidents.

These features have made the steering wheel a control center for various electronic devices located in the vehicle. The increasing number of electrical components, in addition to an air bag, in the relatively small space provided by the steering wheel has increased the precision and tolerances required in manufacturing steering wheels.

A major disadvantage resulting from the high tolerances is that components not meeting exact specifications will not fit together properly. This is especially problematic for electrical components which must be precisely mated to one another for proper engagement. Typically, electrical components in the steering wheel have been mated using male-female connectors. These connectors operate by inserting a first male contact or plug into a second female contact or receptacle, thereby providing a firm connection between the two contacts. However, this type of connection prevents the two contacts from moving relative to one another. If certain steering wheel components are not precisely manufactured, the male-female contacts may not properly align, preventing the proper engagement and mating of the contacts.

Therefore, it would be advantageous to provide an electrical contact assembly which allows for some movement between a first contact and a second contact, to minimize the manufacturing precision required. It would further be advantageous to provide such an electrical contact assembly to allow and maintain proper electrical contact in case of movement between the first and second contact, and further to, simplify assembly and reduce manufacturing costs.

SUMMARY OF THE INVENTION

The present invention is directed to an electrical contact assembly in a steering wheel having a primary circuit board located in the center of the steering wheel around the steering column. The primary circuit board includes left and right arms which engage and cooperate with left and right button assemblies on the steering wheel to actuate various vehicle controls, such as radio volume and tuning control, in the vehicle. The arms include spring contacts which resiliently and non-fixedly engage a secondary circuit board which is connected to control buttons on the steering wheel. The spring contacts connect the primary circuit board to the secondary circuit board and allow for minor movement between the two without loss of electrical contact. Thus, minor deviation in the positioning of the primary or secondary circuit board may be compensated for without the loss of electrical contact.

BRIEF DESCRIPTION OF THE DRAWINGS

FIG. 3A shows the primary circuit board of FIG. 2 with a left arm connected to a secondary circuit board;

FIG. 3B shows a perspective view of a right arm of the primary circuit board;

FIG. 3C shows the right arm with the base of a multi-function button assembly attached thereto;

FIG. 3D shows a perspective view of the right arm engaging the secondary circuit board;

DETAILED DESCRIPTION OF THE DRAWINGS

Figure 1:
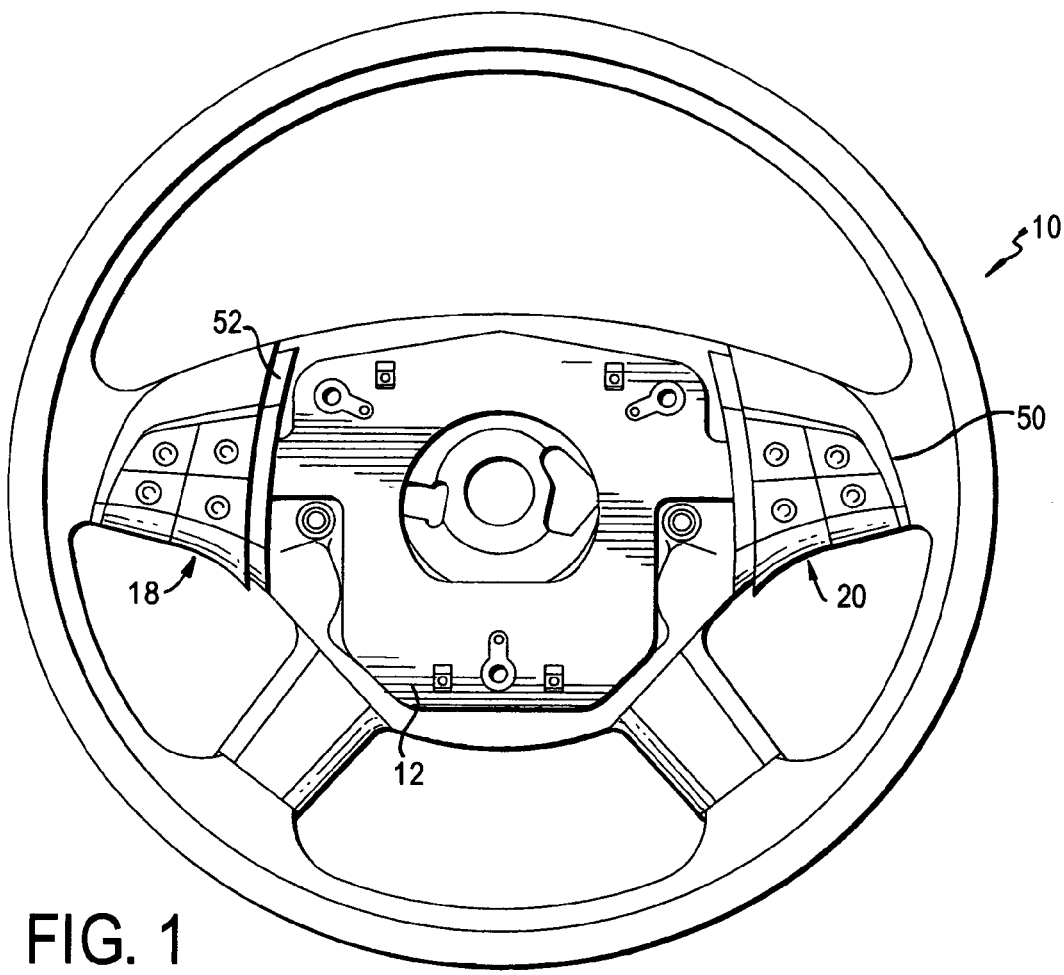
FIG. 1 shows an front view of a steering wheel incorporating the present invention.
Figure 2:
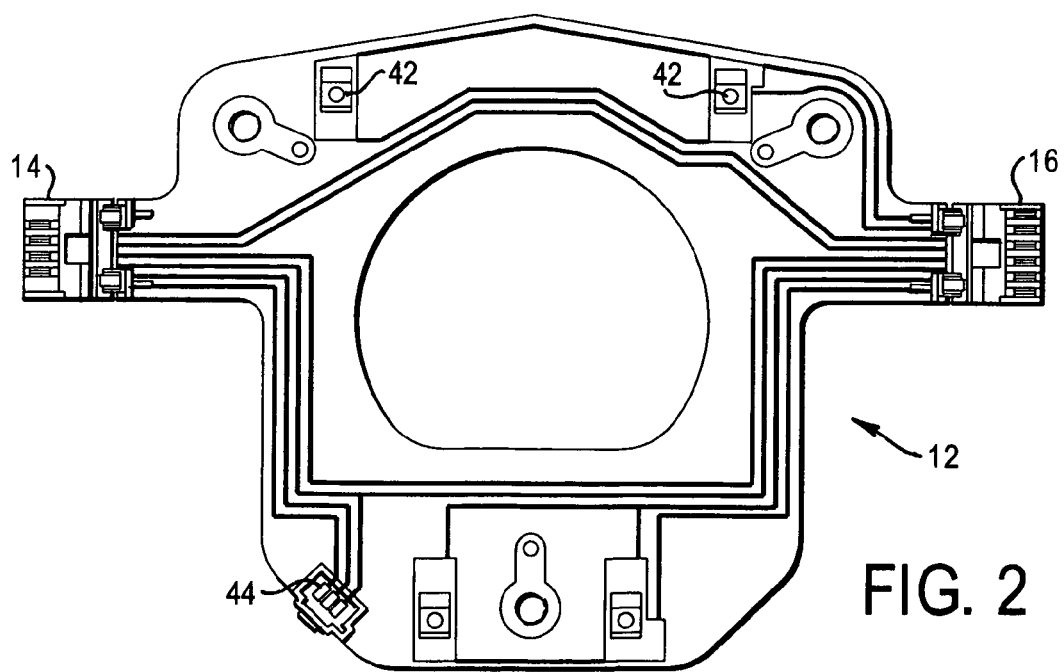
FIG. 2 shows a primary circuit board of the present invention.

Referring now in detail to the drawings, FIG. 1 shows a front view of a steering wheel 10 of the present invention, with its center air bag cover removed, and exposing a primary circuit board 12. The primary circuit board 12 includes a left wing 14 and right wing 16 (see FIG. 2) which extend underneath the left and right multi-function button assemblies 18 and 20. An airbag and the air bag cover (not shown) are placed on top of the primary circuit board 12, such that the air bag cover lies flush with the button assemblies 18 and 20 to give the steering wheel an appealing appearance. The primary circuit board 12 is provided with apertures 13, which fasten the primary circuit board 12 to the center of the steering wheel 10.

Figure 5A:
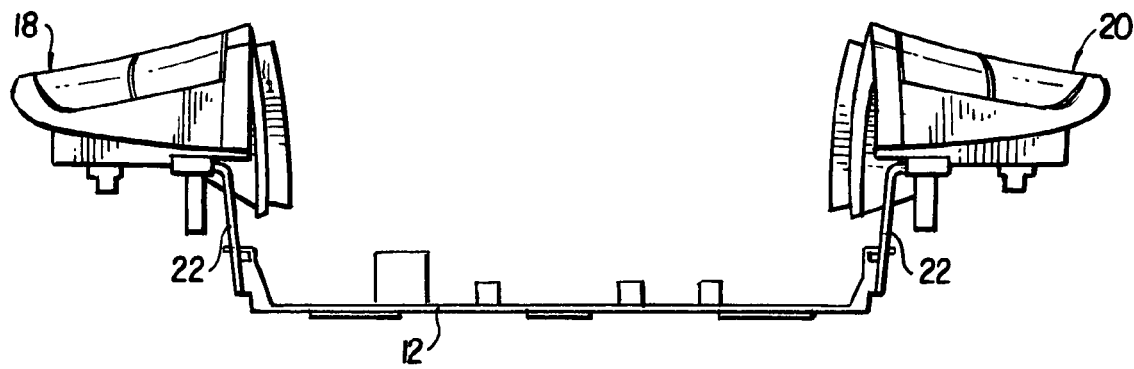
FIG. 5A shows a side view of the contact position assembly of the present invention.

Because of the space required by the air bag, the primary circuit board 12 is spaced vertically distant, i.e. offset from the button assemblies 18 and 20 (see FIG. 5A). Therefore, the left and right wings 14 and 16 of the primary circuit board 12 include vertically extending arms 22 that rise to engage the button assemblies 18 and 20, as best shown in FIGS. 3B and 5A.

FIG. 3B shows the right wing 16 of the primary circuit board 12, and the description of the arms 22 will be given with respect thereto. The arm 22 is formed in a generally L-shape manner so that its top shelf 24 lies substantially parallel to a secondary circuit board 26 of the button assembly 20 (see FIG. 3D). The arm 22 is attached to the primary circuit board 12 by way of bracket 23.

FIG. 3D shows the top shelf 24 having a plurality of spring contacts 28, preferably leaf springs, that extend upward to engage contacts on the bottom surface of the secondary circuit board 26. Because the spring contacts 28 are not fixedly secured to the secondary circuit board 26, they can move horizontally relative to the secondary circuit board 26 without disengaging therefrom. Additionally, the spring contacts 28 resiliently engage the second circuit board 26 in the vertical direction so that any vertical movement of the spring contacts 28 are also compensated for without disengaging from the secondary circuit board 26. The spring contacts 28 are connected to electrical traces 29 on the primary circuit board 12 through an electrical conductor (not shown) in the arms 22.

For purposes of clarity, FIG. 3D shows the spring contacts 28 of the right arm 22 engaging the secondary circuit board 26 without a base 30 of the button assembly 20. However, the base 30 of the button assembly 20 is located adjacent the shelf 24 in between the shelf 24 and the secondary circuit board 26, so that the secondary circuit board 26 is placed onto the base 30. The base 30 includes one or more openings 32 through which the spring contacts 28 protrude to contact the secondary circuit board 26. FIG. 3C shows the right wing 16 having a base 30 without the secondary circuit board 26 thereon, while FIG. 3A shows the left wing 14 with the base 30 and a secondary circuit board 26 attached thereto.

Figure 4:
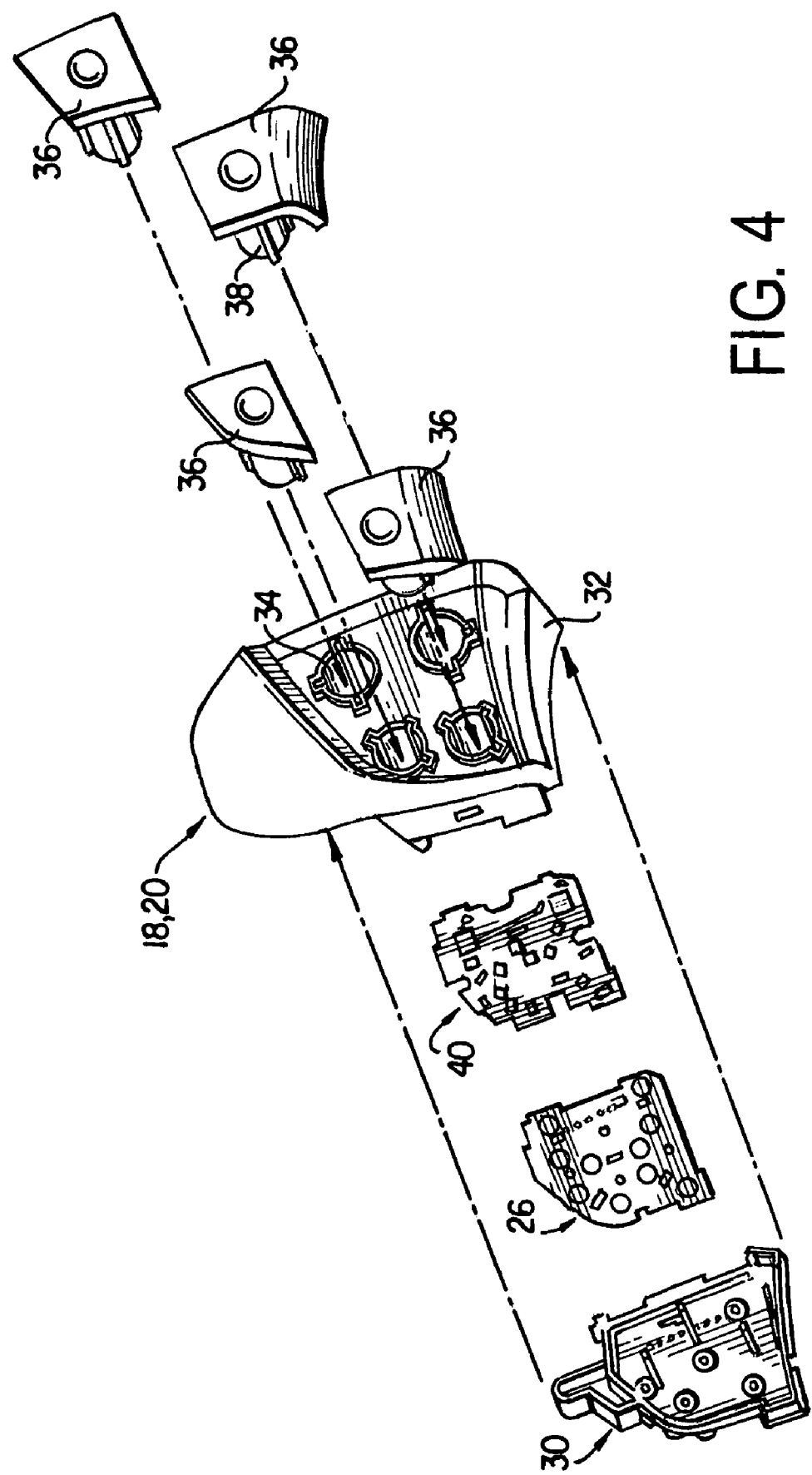
FIG. 4 shows an exploded view of the multi-function button assembly.

FIG. 4 shows an exploded view of the multi-function button assemblies 18 and 20. The button assemblies comprise a housing 32 having multiple chambers 34 therein for holding buttons 36. The buttons 36 operate specific functions in the vehicle, such as controlling the volume of the radio, tuning the radio, increasing or decreasing the cruise control speed, and operation of a mobile phone. Each button 36 contains a pin 38 that is inserted into the chamber 34 for engagement with the secondary circuit board 26. Underneath the housing is a cover 40 having openings to accommodate the pins 38, the secondary circuit board 26, and the base 30, which are discussed above.

As shown in FIG. 3, in addition to the functionality provided for by the buttons 36, the primary circuit board 12 can include additional contacts for other features, such as the contacts for the vehicle horns 42 and a clockspring connector 44. Furthermore, it should be understood that additional features may be incorporated into the primary circuit board 12, and that the features provided for by the buttons 36 may be changed or modified without departing from the scope of the invention.

In operation, a driver would press one of the buttons 36 on the steering wheel 10. The pin 38 of the button 36 would engage a contact on the secondary circuit board 26, which would send an electrical signal via the spring contacts 28, through an electrical conductor (not shown) in the arm 22 to the electrical traces 29 on the primary circuit board 12. The electrical traces 29 connect the left and right button assemblies 18 and 20, and the vehicle horn 42, to the clockpspring connector 44, which acts as the outgoing signal relay point for the primary circuit board 12. The signals are transmitted through the clockspring connector 44 to the corresponding electronic component in the vehicle.

Figure 5B:
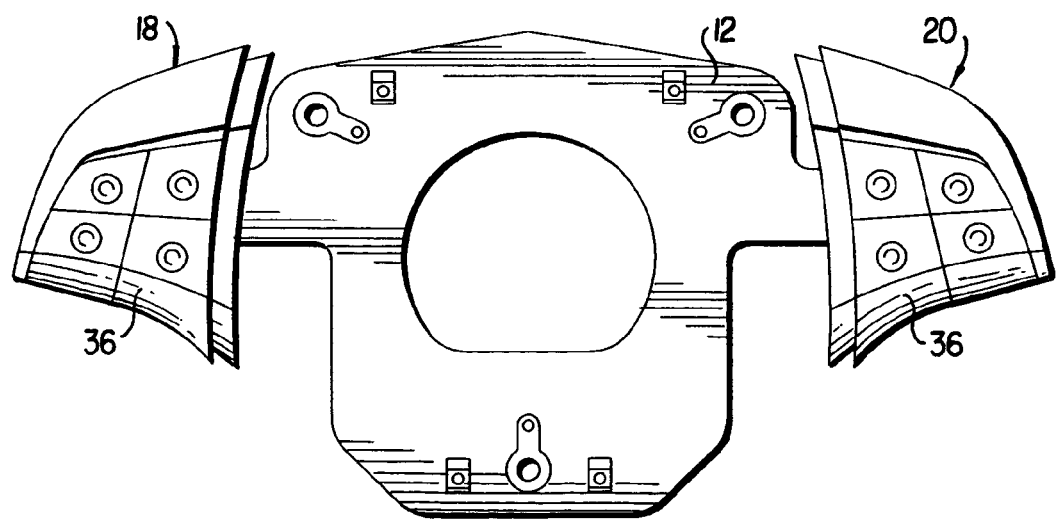
FIG. 5B shows a top view of the contact position assembly of the present invention.

FIGS. 5A and 5B show a side and front view of the primary circuit board 12 connected to the left and right button assemblies 18 and 20. FIG. 5A shows the vertically extending arms 22 of the primary circuit board 12 that create the necessary depth for placement of an airbag in the steering wheel.

The contact assembly of the present invention provides a primary circuit board 12 having contact springs 28 which are not firmly fixed to the corresponding contacts of the secondary circuit board 26, so that the primary circuit board 12 is able to move relative to the secondary circuit board 26. Therefore, any minor deviations in the placement of the primary or secondary circuit boards 12 and 26 may be compensated for by movement of one or the other component.

For example, FIG. 1 shows the steering wheel 10 with left and right button assemblies 18 and 20 located adjacent the center of the steering wheel. Small air gaps 50 and 52 exist between the button assemblies 18 and 20 and the airbag cover (not shown) and the steering wheel edge. In assembling the steering wheel, it may be necessary to move the button assemblies 18 and 20 either right or left to fit properly between the steering wheel edge 50 and the airbag cover. Additionally, the primary circuit board 12 may be required to move vertically (into the page in FIG. 1) to accommodate the air bag. These minor position changes of the primary circuit board 12 or the button assemblies 18 and 20 may be accommodated by the contact spring assembly of the present invention.

Although preferred embodiments are specifically illustrated and described herein, it should be appreciated that many modifications and variations of the present invention are possible in light of the above teachings, without departing from the spirit or scope of the invention.

The invention claimed is:

1. A contact assembly for a steering wheel comprising:
   a first circuit board having at least one vertically extending arm, said arm including a resilient contact thereon for non-fixedly engaging a corresponding contact on a second circuit board, said second circuit board being adapted to cooperate with buttons on the steering wheel to actuate various vehicle functions.

2. The contact assembly of claim 1, wherein said second circuit board is located in a base of a multi-function button assembly, the base having an opening so that the resilient contact of the first circuit board may engage the contact of the second circuit board.

3. The contact assembly of claim 1, wherein the vertically extending arm is generally L-shaped with a top shelf lying generally parallel to said second circuit board, the top shelf having the resilient contact thereon for engaging the corresponding contact on said second circuit board.

4. The contact assembly of claim 2, wherein the resilient contact is a leaf-spring contact that is pressed into engagement with the corresponding contacts of the second circuit board so as to be able to move both laterally and vertically with respect the second circuit board without disengaging therefrom.

5. A steering wheel having a primary circuit board located in a first plane and having at least one arm extending out of said first plane, the at least one arm having resilient contacts on an end thereof;
   a button assembly for controlling various vehicle functions, the button assembly having a secondary circuit board which is connected to the resilient contacts on the at least one arm of the primary circuit board, such that the secondary circuit board lies in a second plane that is offset from the first plane.

6. The steering wheel of claim 5, wherein the at least one arm is generally L-shaped and has a shelf lying adjacent to the second circuit board, and the resilient contacts are located on the shelf.

7. The steering wheel of claim 5, wherein the resilient contacts are leaf-springs that non-fixedly engage the contacts of the second circuit board so that they can move parallel or perpendicular to the second plane without disengaging from the contacts of the second circuit board.

8. The steering wheel of claim 5, wherein the primary circuit board is located in the center of the steering wheel and includes two wings extending in generally opposite directions therefrom, the wings each having the at least one arm for engaging the secondary circuit board, and two button assemblies located on opposite sides of the center of the steering wheel for cooperating with each arm of the primary circuit board.

9. The steering wheel of claim 5, wherein the button assembly includes a housing having at least one cavity therein, the at least one cavity holding at least one button which controls a vehicle function, the at least one button having a pin extending through the cavity for engaging the second circuit board.

10. The steering wheel of claim 9, wherein the button assembly includes a base that lies between the at least one arm and the secondary circuit board, the base having an opening to allow the resilient contacts to protrude therethrough to engage the contacts of the secondary circuit board.

* * * * *